(12) United States Patent
Liu et al.

(10) Patent No.: US 12,326,412 B2
(45) Date of Patent: Jun. 10, 2025

(54) DISPLAY SUBSTRATES, DISPLAY APPARATUSES AND METHODS OF DETECTING CRACKS IN DISPLAY SUBSTRATES

(71) Applicants: Chengdu BOE Optoelectronics Technology Co., Ltd., Sichuan (CN); BOE Technology Group Co., Ltd., Beijing (CN)

(72) Inventors: Tingliang Liu, Beijing (CN); Yuanjie Xu, Beijing (CN); Yue Long, Beijing (CN); Siyu Wang, Beijing (CN); Yuge Chu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/026,517

(22) PCT Filed: Jan. 7, 2022

(86) PCT No.: PCT/CN2022/070787
§ 371 (c)(1),
(2) Date: Mar. 15, 2023

(87) PCT Pub. No.: WO2023/130369
PCT Pub. Date: Jul. 13, 2023

(65) Prior Publication Data
US 2024/0298485 A1    Sep. 5, 2024

(51) Int. Cl.
*G01N 27/24*   (2006.01)
*G01R 27/26*   (2006.01)
(Continued)

(52) U.S. Cl.
CPC .......... *G01N 27/24* (2013.01); *G01R 27/2605* (2013.01); *H10K 59/10* (2023.02); *H10K 59/131* (2023.02)

(58) Field of Classification Search
CPC .. H10K 59/131; H10K 59/10; G01R 27/2605; G01N 27/24
See application file for complete search history.

(56) References Cited

U.S. PATENT DOCUMENTS

2008/0198287 A1  8/2008  Kim et al.
2017/0263880 A1  9/2017  Lee et al.
(Continued)

FOREIGN PATENT DOCUMENTS

CN   109752421 A   5/2019
CN   110335886 A   10/2019
(Continued)

OTHER PUBLICATIONS

PCT/CN2022/070787 international search report.
PCT/CN2022/070787 Written Opinion.

*Primary Examiner* — Amy He
(74) *Attorney, Agent, or Firm* — IPro, PLLC

(57) ABSTRACT

A display substrate (100), a display apparatus, and a method of detecting cracks in a display substrate (100). A display substrate (100) includes a display area (101) and a frame area (102) disposed at least on a side of the display area (101), the frame area (102) including a crack detection area (1021). The display substrate (100) includes a base substrate (10), a detection wiring (82) on the base substrate (10), and a conductive layer (30) on a side of the detection wiring (82) away from the base substrate (10); the conductive layer (30) is disposed in the frame area (102); the detection wiring (82) is disposed in the crack detection area (1021); and at least a portion of an orthographic projection of the detection wiring (82) on the base substrate (10) falls within an orthographic (Continued)

projection of the conductive layer (30) on the base substrate (10). A display apparatus includes the display substrate.

20 Claims, 6 Drawing Sheets

(51) Int. Cl.
   *H10K 59/10* (2023.01)
   *H10K 59/131* (2023.01)

(56) References Cited

U.S. PATENT DOCUMENTS

| | | | |
|---|---|---|---|
| 2021/0118345 A1* | 4/2021 | Jung | .................. G09G 3/006 |
| 2021/0359245 A1 | 11/2021 | Wu | |
| 2022/0199651 A1 | 6/2022 | Xu et al. | |
| 2023/0046867 A1 | 2/2023 | Wang et al. | |

FOREIGN PATENT DOCUMENTS

| | | | |
|---|---|---|---|
| CN | 111366619 A | 7/2020 |
| CN | 112289778 A | 1/2021 |
| CN | 112378960 A | 2/2021 |
| CN | 112669737 A | 4/2021 |
| CN | 112885844 A | 6/2021 |
| CN | 113157137 A | 7/2021 |
| JP | 2007123793 A | 5/2007 |
| KR | 20200075410 A | 6/2020 |

* cited by examiner

DISPLAY SUBSTRATES, DISPLAY APPARATUSES AND METHODS OF DETECTING CRACKS IN DISPLAY SUBSTRATES

CROSS-REFERENCE TO RELATED APPLICATIONS

This application is the U.S. national phase of PCT Application No. PCT/CN2022/070787 filed on Jan. 7, 2022, the disclosure of which is incorporated herein by reference in its entirety.

TECHNICAL FIELD

This application relates to the field of display technology, and in particular to a display substrate, a display apparatus, and a method of detecting cracks in a display substrate.

BACKGROUND

With the continuous development of science and technology, more and more display devices are widely used in people's daily life and work, becoming an indispensable and important tool for people.

During the production and use of a display device, electrostatic charges may inevitably be generated. When the electrostatic charges are conducted to a thin-film transistor of a pixel circuit in a display panel, the characteristics of the thin-film transistor may shift, which in turn affects the display effect of the display panel.

SUMMARY

According to a first aspect of embodiments of the present application, there is provided a display substrate. The display substrate includes a display area and a frame area disposed at least on a side of the display area, the frame area including a crack detection area;
the display substrate includes a base substrate, a detection wiring on the base substrate, and a conductive layer on a side of the detection wiring away from the base substrate; the conductive layer is disposed in the frame area; the detection wiring is disposed in the crack detection area; and at least a portion of an orthographic projection of the detection wiring on the base substrate falls within an orthographic projection of the conductive layer on the base substrate.

In an embodiment, the conductive layer is connected to a constant electrical signal; and the conductive layer covers at least a portion of the crack detection area.

In an embodiment, the frame area further includes a crack-prevention area located on a side of the crack detection area away from the display area, and the display substrate further includes a patterned conductive material layer located in the crack-prevention area; the conductive material layer is located between the conductive layer and the base substrate; and at least a portion of an orthographic projection of the conductive material layer on the base substrate falls within the orthographic projection of the conductive layer on the base substrate.

In an embodiment, the conductive material layer is in the form of a grid.

In an embodiment, the conductive material layer is electrically connected to the conductive layer.

In an embodiment, the display substrate includes a plurality of inorganic layers, which are located in an area other than the crack-prevention area.

In an embodiment, the frame area further includes a power signal line area located between the crack detection area and the display area, and the display substrate further includes a low-level power signal line located in the power signal line area; and
at least a portion of an orthographic projection of the low-level power signal line on the base substrate falls within the orthographic projection of the conductive layer on the base substrate; or an edge of the orthographic projection of the conductive layer on the base substrate close to the display area coincides with an edge of the orthographic projection of the low-level power signal line on the base substrate away from the display area.

In an embodiment, the display substrate includes a touch layer disposed on the base substrate, the touch layer includes a plurality of touch electrodes, and the touch layer is at least partially located in the display area; and the conductive layer and the touch electrodes are arranged in a same layer.

In an embodiment, the display substrate includes a pixel circuit layer disposed on the base substrate, and the pixel circuit layer is at least partially located in the display area; and the pixel circuit layer includes a plurality of conductive film layers, and the conductive layer and at least one of the conductive film layers in the pixel circuit layer are arranged in a same layer.

In an embodiment, the pixel circuit layer includes pixel circuits, each of which includes a thin-film transistor and a capacitor, the thin-film transistor includes a source electrode and a gate electrode, the capacitor includes a first capacitor plate and a second capacitor plate, and the first capacitor plate and the gate electrode are arranged in a same layer; and
the plurality of conductive film layers include the gate electrode, the source electrode, and the second capacitor plate; and the conductive layer is arranged in a same layer as the source electrode.

In an embodiment, at least a portion of the detection wiring is arranged in a same layer as at least one of the gate electrode and the second capacitor plate.

In an embodiment, the frame area further includes a power signal line area located between the crack detection area and the display area, and the display substrate further includes a low-level power signal line located in the power signal line area; and the conductive layer is arranged in a same layer as the low-level power signal line.

In an embodiment, the conductive layer is connected to the low-level power signal line; or the conductive layer is connected to a different signal than the low-level power signal line.

In an embodiment, the frame area further includes a crack-prevention area located on a side of the crack detection area away from the display area, and a cut-retention area located on a side of the crack-prevention area away from the crack detection area, and the conductive layer covers at least a portion of the cut-retention area.

In an embodiment, the conductive layer is connected to a ground signal; or the conductive layer is connected to a low-level power signal.

In an embodiment, the frame area further includes a gate drive area located between the display area and the crack detection area, and the gate drive area is provided with gate drive circuits; and the conductive layer is located in an area other than the gate drive area.

According to a second aspect of embodiments of the present application, there is provided a display apparatus. The display apparatus includes the display substrate as described above.

According to a third aspect of embodiments of the present application, there is provided a method of detecting cracks in a display substrate. The method is applied to the display substrate, the display substrate including a display area and a frame area disposed at least on a side of the display area, the frame area including a crack detection area; the display substrate including a base substrate, a detection wiring on the base substrate, and a conductive layer on a side of the detection wiring away from the base substrate; the conductive layer being disposed in the frame area; the detection wiring being disposed in the crack detection area; at least a portion of an orthographic projection of the detection wiring on the base substrate falling within an orthographic projection of the conductive layer on the base substrate; and the conductive layer being connected to a constant electrical signal, and the method includes:
  detecting a first capacitance value, where the first capacitance value is the sum of capacitance values between the detection wiring and other conductive structures of the display substrate, the other conductive structures including the conductive layer; and
  determining that there is a crack in the detection wiring, in response to the first capacitance value being not within a capacitance threshold range.

In an embodiment, after determining that there is the crack in the detection wiring, the method further includes:
  determining a position of the crack in the detection wiring according to the first capacitance value.

In an embodiment, the detection wiring has same thickness and width at each portion thereof, and determining the position of the crack in the detection wiring according to the first capacitance value includes:
  determining a length of wiring between the position of the crack in the detection wiring and the beginning of the detection wiring; and
  determining the position of the crack in the detection wiring according to the length of wiring,
  where the length of wiring is determined from the following equation:

$$Lx=(Cx-C0)*L/(C1-C0)$$

where Cx is the first capacitance value; C0 is a second capacitance value, the second capacitance value being the sum of capacitance values between the detection wiring and other conductive structures of the display substrate except the conductive layer; C1 is a third capacitance value, the third capacitance value being the sum of capacitance values between the detection wiring and other conductive structures of the display substrate including the conductive layer, when there is no crack in the detection wiring; L is a total length of the detection wiring, and Lx is the length of wiring between the position of the crack in the detection wiring and the beginning of the detection wiring.

With the display substrate, display apparatus and method of detecting cracks in the display substrate according to the embodiments of the present application, the conductive layer in the display substrate is located on the side of the detection wiring away from the base substrate, and at least a portion of the orthographic projection of the detection wiring on the base substrate falls within the orthographic projection of the conductive layer on the base substrate. In this way, the conductive layer may prevent electrostatic charges accumulated on a surface of the display substrate from being conducted in a direction close to the base substrate, which effectively prevents the electrostatic charges from being conducted to the pixel circuit layer of the display substrate, improves a shift in the characteristics of the thin-film transistor in the pixel circuit layer due to the electrostatic charges, and improves the display effect of the display panel.

DETAILED DESCRIPTION OF THE EMBODIMENTS

Figure 1:
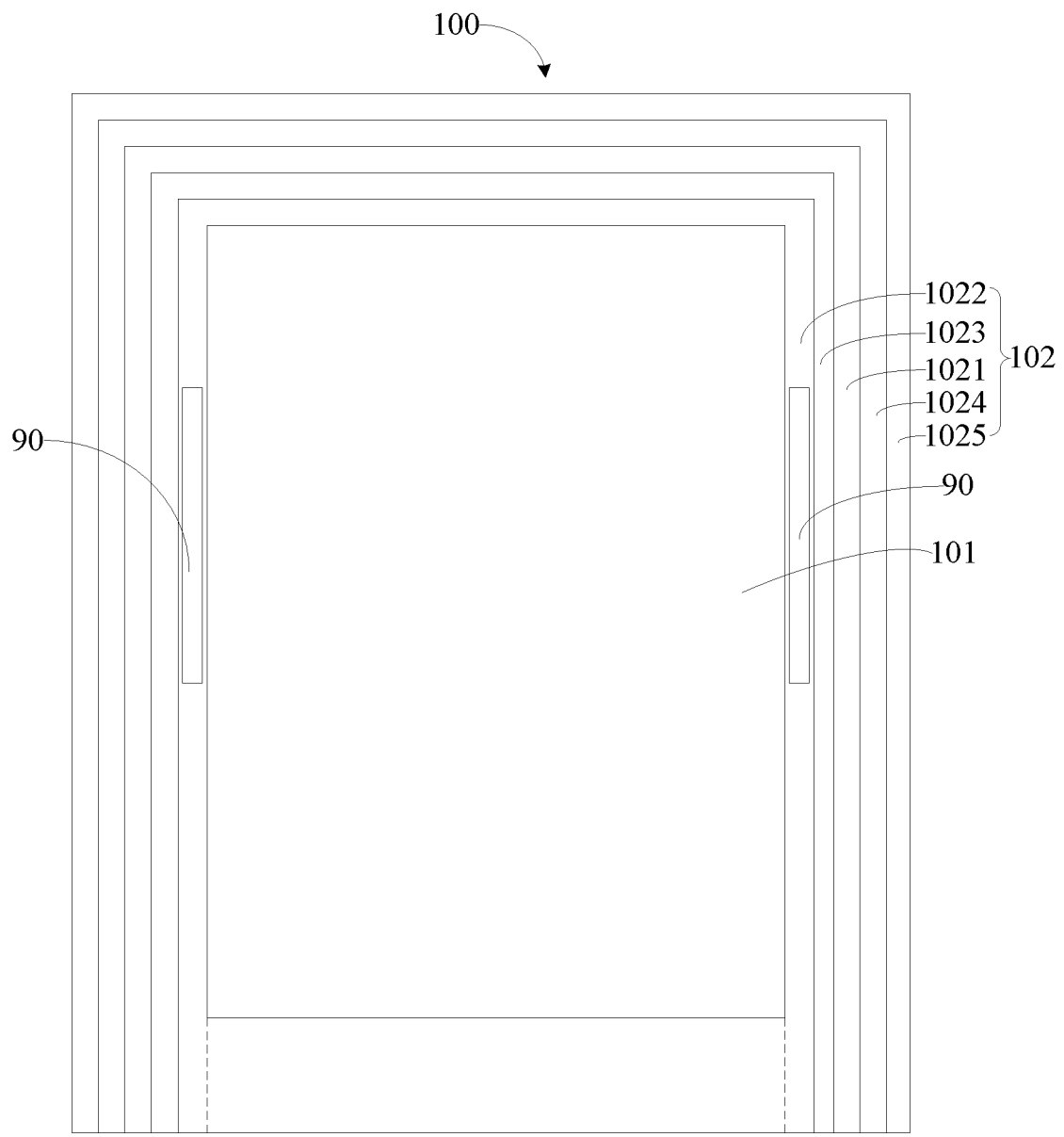
FIG. 1 is a schematic structural diagram of a display substrate according to an exemplary embodiment of the present application.

Exemplary embodiments will be described in detail herein, and examples thereof are illustrated in the drawings. When the following description refers to the drawings, the same numerals in different drawings indicate the same or similar elements, unless otherwise indicated. Embodiments described in the following exemplary embodiments do not represent all embodiments in accordance with the present application. Rather, they are merely examples of apparatuses and methods in accordance with some aspects of the present application as detailed in the appended claims.

Terms used in the present application are only for the purpose of describing specific embodiments, and are not intended to limit the present application. Singular forms of "a", "said", and "the" used in the present application and the appended claims are also intended to include plural forms, unless the context clearly indicates otherwise. It should also be understood that the term "and/or" as used herein refers to and includes any or all possible combinations of one or more of the associated listed items.

It should be understood that though terms "first", "second", "third", etc. may be used in the present application to describe various information, such information should not be limited by these terms. These terms are only used to distinguish the same type of information from each other. For example, without departing from the scope of the present application, first information may also be referred to as second information, and similarly, second information may also be referred to as first information. Depending on the context, the word "if" as used herein may be interpreted as "when", "upon" or "in response to determining".

Embodiments of the present application provide a display substrate, a display apparatus, and a method of detecting cracks in a display substrate. The display substrate, display apparatus, and method of detecting cracks in the display substrate according to the embodiments of the present application will be described in detail below in conjunction with the drawings. Features in the embodiments described below may complement each other or be combined with each other without conflict.

Embodiments of the present application provide a display substrate. Referring to FIG. 1, the display substrate 100 includes a display area 101 and a frame area 102 disposed at least on a side of the display area 101. The frame area 102 includes a crack detection area 1021.

Referring to FIGS. 2 to 4A, the display substrate 100 includes a base substrate 10, a detection wiring 82 on the base substrate 10, and a conductive layer 30 on a side of the detection wiring 82 away from the base substrate 10. The conductive layer 30 is disposed in the frame area 102. The detection wiring 82 is disposed in the crack detection area 1021. At least a portion of an orthographic projection of the detection wiring 82 on the base substrate 10 falls within an orthographic projection of the conductive layer 30 on the base substrate 10.

With the display substrate according to the embodiments of the present application, the conductive layer 30 is located on the side of the detection wiring 82 away from the base substrate 10, and at least a portion of the orthographic projection of the detection wiring 82 on the base substrate 10 falls within the orthographic projection of the conductive layer 30 on the base substrate. In this way, the conductive layer 30 may prevent electrostatic charges accumulated on a surface of the display substrate from being conducted in a direction close to the base substrate, which effectively prevents the electrostatic charges from being conducted to a pixel circuit layer of the display substrate, improves a shift in the characteristics of a thin-film transistor in the pixel circuit layer due to the electrostatic charges, and improves the display effect of the display panel.

In an embodiment, the conductive layer 30 is connected to a constant electrical signal. In this way, the conductive layer 30 may effectively prevent electrostatic charges accumulated on a surface of the display substrate from being conducted in a direction close to the base substrate 10.

In an embodiment, referring to FIG. 1 again, the frame area 102 of the display substrate 100 includes a left frame, an upper frame, and a right frame of the display substrate. The frame area 102 of the display substrate may further include a lower frame. The lower frame may be a frame of the display substrate for binding a driver chip. The upper frame is opposite to the lower frame, and the left frame is opposite to the right frame.

In an embodiment, the frame area 102 of the display substrate 100 further includes a gate drive area 1022 located between the display area 101 and the crack detection area 1021, a power signal line area 1023 located between the gate drive area 1022 and the crack detection area 1021, and a crack-prevention area 1024 located on a side of the crack detection area 1021 away from the display area 101. The sum of widths of the crack detection area 1021 and the crack-prevention area 1024 ranges from 162 μm to 198 μm. In some embodiments, the sum of the widths of the crack detection area 1021 and the crack-prevention area 1024 may be 162 μm, 170 μm, 175 μm, 180 μm, 185 μm, 190 μm, 198 μm, etc.

In some embodiments, the display substrate is generally mass-produced, and a plurality of display substrates share a common base substrate. After the film layer structure of the display substrates is fabricated, the common base substrate needs to be cut to obtain a plurality of independent display substrates, with the base substrate of each display substrate being a part of the common base substrate. Before cutting the common base substrate, the frame area 102 of the display substrate further includes a cut area located on a side of the crack-prevention area 1024 away from the display area 101, with a width of the cut area ranging from 108 μm to 132 μm. In some embodiments, the width of the cut area may be 108 μm, 110 μm, 115 μm, 120 μm, 125 μm, 132 μm, etc. In the case of ideal cutting, after the display substrate is cut, the cut area is entirely cut off, and an edge of the base substrate of the display substrate is flush with an edge of the crack-prevention area 1024. However, due to the existence of cutting errors, the cut area of the display substrate obtained after cutting may be partially retained, and the frame area 102 further includes a cut-retention area 1025 located on the side of the crack-prevention area 1024 away from the display area 101.

In an embodiment, as shown in FIGS. 1 to 4C, a gate drive circuit 90 is provided in the gate drive area 1022, and the conductive layer 30 is located in an area other than the gate drive area 1022. The gate drive circuit includes transistors and capacitors. By providing the conductive layer 30 in the area other than the gate drive area 1022, it is possible to avoid signal interference to the gate drive circuit due to formation of coupling capacitance between the conductive layer 30 and a conductive structure in the gate drive area 1022, which helps to ensure the display effect of the display substrate.

In an embodiment, as shown in FIG. 2 to FIG. 4C, the display substrate further includes a low-level power signal line 81 located in the power signal line area 1023. The low-level power signal line 81 is configured to be connected to a low-level power signal.

In an embodiment, as shown in FIG. 2 to FIG. 4C, the display substrate further includes a patterned conductive material layer 83 disposed in the crack-prevention area 1024. The conductive material layer 83 is located between the conductive layer 30 and the base substrate 10, and the conductive material layer 83 is connected to a constant electrical signal. At least a portion of an orthographic projection of the conductive material layer 83 on the base substrate 10 falls within the orthographic projection of the conductive layer 30 on the base substrate 10.

By providing the patterned conductive material layer 83 in the crack-prevention area 1024, during cutting of the common base substrate, the conductive material layer 83 can prevent cracks from extending toward the display area, so as to avoid the situation where the cracks continue to extending in a direction toward the display area 101, resulting in damages to the gate drive circuit in the gate drive area or the pixel circuit in the display area, and in turn causing some sub-pixels in the display panel to fail to emit light normally, which helps to improve the display reliability of the display panel. Since the conductive material layer 83 is connected to the constant electrical signal, the conductive material layer 83 can play the role of shielding electrostatic charges, further preventing the electrostatic charges from being conducted to the display area 101, and further ensuring the display effect of the display substrate.

Figure 5:
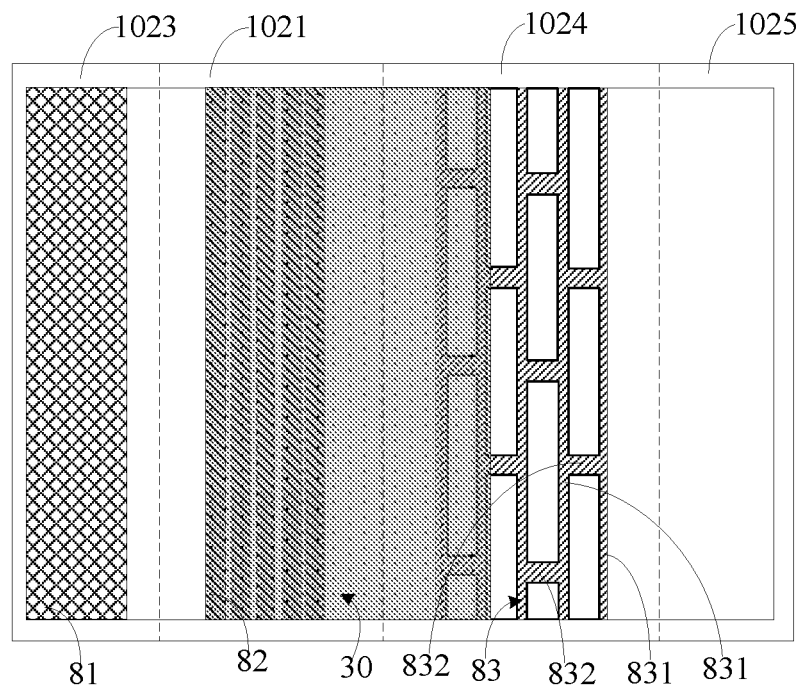
FIG. 5 is a schematic diagram of a partial structure of a display substrate according to another embodiment of the present application.

Further, the conductive material layer 83 is in the form of a grid. In this way, during cutting of the common base substrate, the conductive material layer 83 can more effectively prevent the cracks from extending toward the display area. As shown in FIG. 5, the conductive material layer 83 includes a plurality of first wires 831 extending in the same direction, and second wires 832 located between adjacent first wires 831. A plurality of second wires 832 may be provided between the adjacent first wires 831. The adjacent first wires 831 are connected to each other through the second wires 832, such that the conductive material layer 83 as a whole is in the form of a grid.

Further, as shown in FIG. 2 to FIG. 4C, the conductive material layer 83 is electrically connected to the conductive layer 30. Since the conductive layer 30 is connected to a stable electrical signal, and the conductive material layer 83 is electrically connected to the conductive layer 30, the conductive material layer 83 is connected to the same stable electrical signal as the conductive layer. In the embodiments shown in FIG. 2 and FIG. 3, the conductive material layer 83 is in direct contact with the conductive layer 30. In the embodiment shown in FIG. 4A, an insulating layer is provided between the conductive material layer 83 and the conductive layer 30, and the conductive material layer 83 is electrically connected to the conductive layer 30 via through holes penetrating the insulating layer therebetween.

In an embodiment, referring to FIG. 2 to FIG. 4C, the display substrate further includes a pixel circuit layer 40 disposed on the base substrate 10, a light-emitting layer 50 disposed on a side of the pixel circuit layer 40 away from the base substrate 10, an encapsulation layer 60 disposed on a side of the light-emitting layer 50 away from the base substrate 10, and a touch layer 70 disposed on a side of the encapsulation layer 60 away from the base substrate 10. The pixel circuit layer 40 is at least partially located in the display area 101, and the light-emitting layer 50 is located in the display area 101. The encapsulation layer 60 is located in the display area 101 and the frame area 102, and the encapsulation layer 60 may cover the gate drive area 1022, the power signal line area 1023, the crack detection area 1021, and the crack-prevention area 1024 in the frame area 102.

In an embodiment, the light-emitting layer 50 includes a plurality of sub-pixels 501, each of which includes a first electrode 51, an organic light-emitting layer 52 disposed on a side of the first electrode 51 away from the base substrate 10, and a second electrode 53 disposed on a side of the organic light-emitting layer 52 away from the base substrate 10. The first electrode 51 may be an anode, and the second electrode 53 may be a cathode. The second electrodes 53 of the sub-pixels 501 of the light-emitting layer 50 may be a surface electrode connected into one piece. The cathode of the sub-pixel may be electrically connected to the low-level power signal line 81, which provides a low-level power signal to the cathode. The low-level power signal connected to the cathode of the sub-pixel is a constant electrical signal, then in the display area 101, the cathode of the sub-pixel may prevent electrostatic charges from being conducted to the pixel circuit.

The light-emitting layer 50 further includes a pixel definition layer 54, which is provided with pixel openings corresponding to the sub-pixels one to one. The first electrode 51 is disposed between the pixel definition layer 54 and the pixel circuit layer 40, and each pixel opening exposes at least a portion of the corresponding first electrode 51.

In an embodiment, the pixel circuit layer 40 includes a plurality of pixel circuits, which may correspond to the sub-pixels 501 one to one, and each pixel circuit drives the corresponding sub-pixel 501.

In an embodiment, the pixel circuit includes a thin-film transistor 401 and a capacitor 402. The thin-film transistor 401 includes an active layer 41, a gate electrode 42, a first pole 43, and a second pole 44. One of the first pole 43 and the second pole 44 is a source electrode, and the other of the first pole 43 and the second pole 44 is a drain electrode. The capacitor 402 includes a first capacitor plate 45 and a second capacitor plate 46 disposed on a side of the first capacitor plate 45 away from the base substrate 10. The gate electrode 42 and the first capacitor plate 45 may be arranged in the same layer, and the first pole 43 and the second pole 44 may be arranged in the same layer. Two structures being arranged in the same layer means that the two structures are located in the same layer and made of the same material, and may be formed simultaneously in a single patterning process.

The pixel circuit layer 40 may further include a gate insulating layer 403, a capacitor insulating layer 404, an interlayer dielectric layer 405, and a planarization layer 406. The gate insulating layer 403 is disposed between the active layer 41 and the gate electrode 42, the capacitor insulating layer 404 is disposed between the first capacitor plate 45 and the second capacitor plate 46, and the interlayer dielectric layer 405 is disposed between the second capacitor plate 46 and the planarization layer 406. A part of the first pole 43 and the second pole 44 is disposed between the interlayer dielectric layer 405 and the planarization layer, and the other part of the first pole 43 and the second pole 44 is electrically connected to the active layer 41 via through holes penetrating the interlayer dielectric layer 405, the capacitor insulating layer 404, and the gate insulating layer 403. The first electrode 51 of the sub-pixel 501 is electrically connected to the first pole 43 of the thin-film transistor 401 via a through hole penetrating the planarization layer 406. When the thin-film transistor 401 is an n-type transistor, the first pole 43 is a source electrode, and when the thin-film transistor 401 is a p-type transistor, the first pole 43 is a drain electrode.

In some embodiments, as shown in FIG. 2 to FIG. 4B, the pixel circuit layer 40 includes a plurality of conductive film layers, the plurality of conductive film layers including the gate electrode 42 of the thin-film transistor 401, the source electrode of the thin-film transistor 401, and the second capacitor plate 46 of the capacitor 402.

Figure 4A:
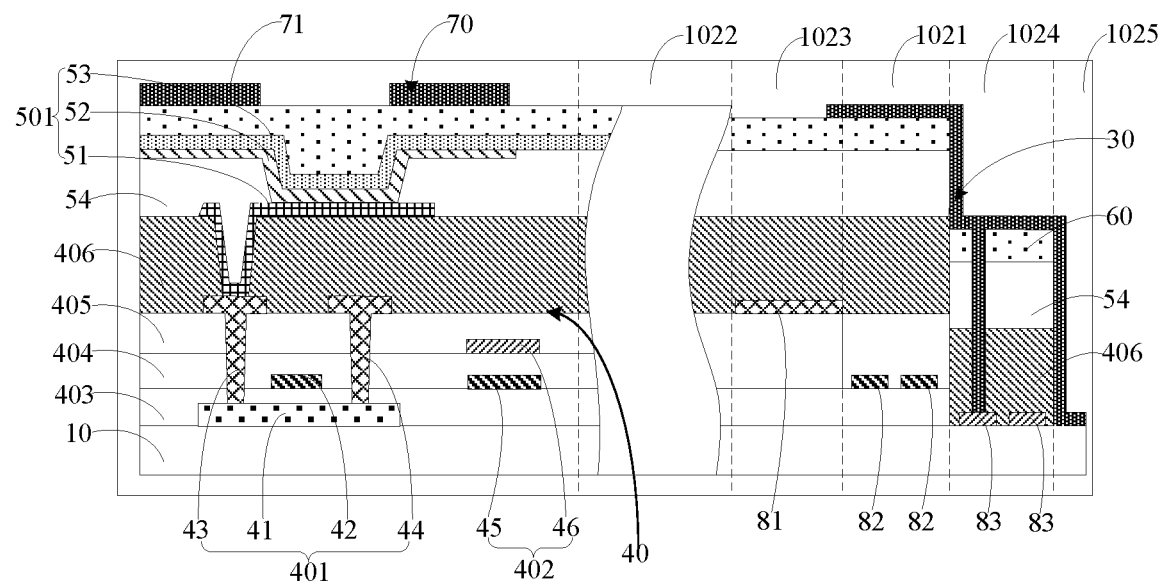
FIG. 4A is a partial cross-sectional view of a display substrate according to still another exemplary embodiment of the present application.
Figure 4B:
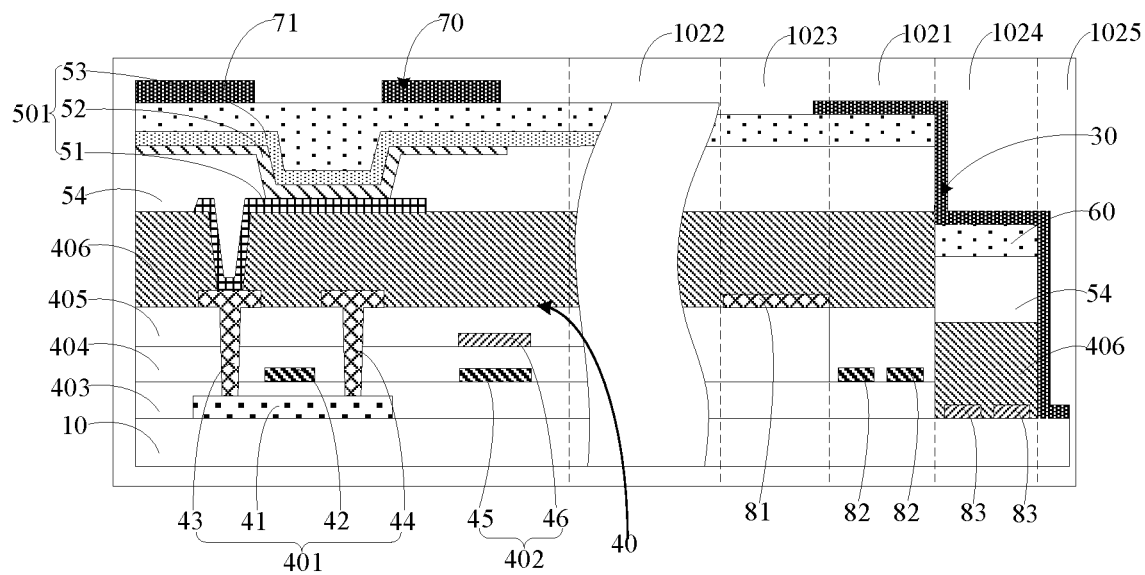
FIG. 4B is a partial cross-sectional view of a display substrate according to yet another exemplary embodiment of the present application.
Figure 4C:
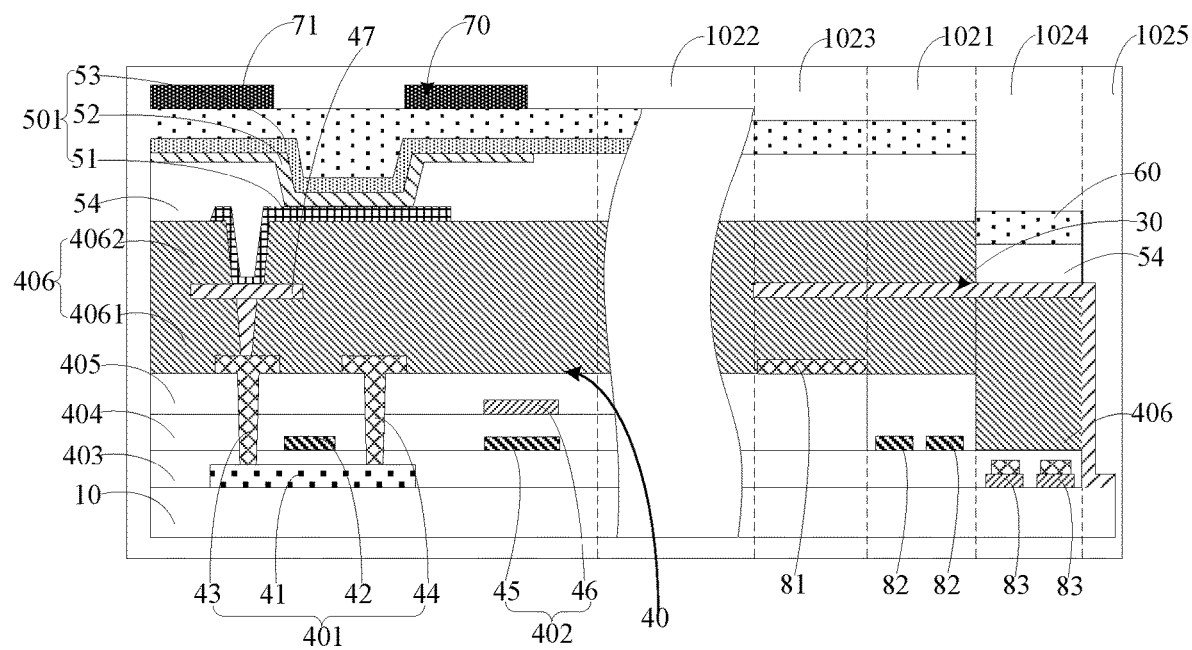
FIG. 4C is a partial cross-sectional view of a display substrate according to yet another exemplary embodiment of the present application.

In an embodiment, as shown in FIG. 4C, the pixel circuit layer 40 further includes a transfer portion 47, the planarization layer 406 includes a first sub-planarization layer 4061 and a second sub-planarization layer 4062 disposed on a side of the first sub-planarization layer 4061 away from the base substrate 10, and the transfer portion 47 is located between the first sub-planarization layer 4061 and the second sub-planarization layer 4062. The first electrode 51 is electrically connected to the first pole 43 of the thin-film transistor 401 through the transfer portion 47. The plurality of conductive film layers in the pixel circuit layer 40 further include the transfer portion 47.

In an embodiment, at least a portion of the detection wiring 82 is arranged in the same layer as the gate electrode 42 or the second capacitor plate 46. In this way, the detection wiring 82 may be formed simultaneously with the gate electrode 42 or the second capacitor plate 46, without a separate process step to form the detection wiring 82, which helps to simplify the preparation process of the display substrate.

In some embodiments, a portion of the detection wiring 82 is arranged in the same layer as the gate electrode, and the other portion of the detection wiring 82 is arranged in the same layer as the second capacitor plate, and the portion arranged in the same layer as the gate electrode is electrically connected to the portion arranged in the same layer as the second capacitor plate via through holes penetrating the capacitor insulating layer. In other embodiments, each portion of the detection wiring 82 is located in the same layer, and the detection wiring 82 is arranged in the same layer as the gate electrode 42, or the detection wiring 82 is arranged in the same layer as the second capacitor plate 46. In the embodiments shown in FIG. 2 to FIG. 4C, the detection wiring 82 is arranged in the same layer as the gate electrode 42.

In an embodiment, at least a portion of the conductive material layer 83 is arranged in the same layer as the gate electrode 42 or the second capacitor plate 46. In this way, the conductive material layer 83 may be formed simultaneously with the gate electrode 42 or the second capacitor plate 46, without a separate process step to form the conductive material layer 83, which helps to simplify the preparation process of the display substrate.

In some embodiments, a portion of the conductive material layer 83 is arranged in the same layer as the gate electrode, and the other portion of the conductive material layer 83 is arranged in the same layer as the second capacitor plate, and the portion arranged in the same layer as the gate electrode is electrically connected to the portion arranged in the same layer as the second capacitor plate via through holes penetrating the capacitor insulating layer. In other embodiments, each portion of the conductive material layer 83 is located in the same layer, and the conductive material layer 83 is arranged in the same layer as the gate electrode 42, or the conductive material layer 83 is arranged in the same layer as the second capacitor plate 46. In the embodiments shown in FIG. 2 to FIG. 4C, the conductive material layer 83 is arranged in the same layer as the second capacitor plate 46.

In an embodiment, the encapsulation layer 60 is a thin film encapsulation layer, which may include organic and inorganic layers arranged alternately. For example, the thin film encapsulation layer includes two inorganic layers and an organic layer located between the two inorganic layers.

In an embodiment, the touch layer 70 includes a plurality of touch electrodes 71 arranged at intervals. The touch electrodes 71 may be located in the display area 101, or the touch electrodes 71 may be partially located in the display area 101 and partially extend into the frame area 102.

Figure 4D:
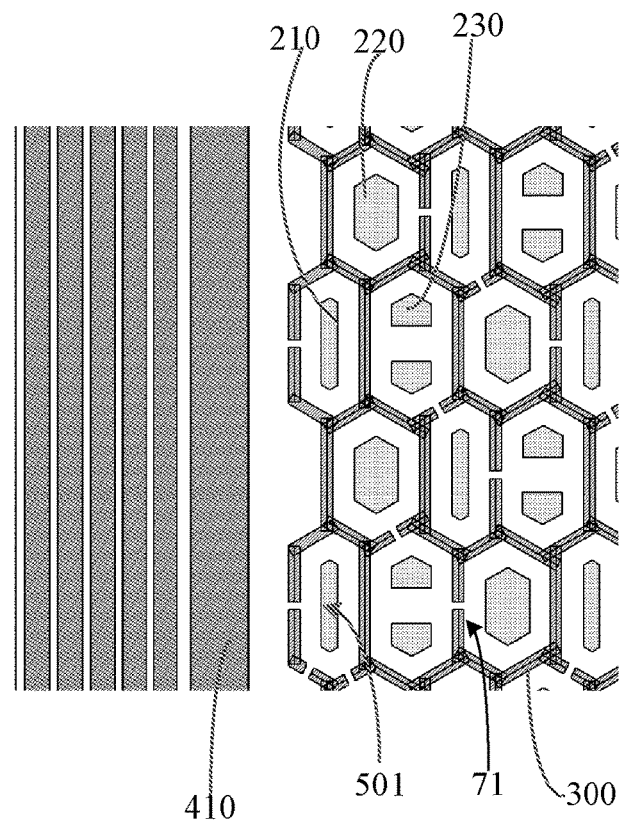
FIG. 4D is a schematic diagram of a partial structure of a display substrate according to an exemplary embodiment of the present application.

As shown in FIG. 4D, the touch electrodes 71 include a touch grid pattern 300, and each touch grid in the touch grid pattern 300 is disposed around at least one sub-pixel 501.

As shown in FIG. 4D, the plurality of sub-pixels of the display substrate are divided into a plurality of pixel units, each of which may include a red sub-pixel 210, a green sub-pixel 220, and a blue sub-pixel 230. In the embodiment shown in FIG. 4C, there are two green sub-pixels 220 in one pixel unit, and each color sub-pixel 501 corresponds to a touch grid.

As shown in FIG. 4D, the display substrate further includes a touch signal line 410 located on an outer side of the touch electrodes 71, and the touch signal line 410 is electrically connected to the touch grid pattern 300 in the touch layer. The touch signal line 410 may be a TX line (transmission signal line) or an RX line (reception signal line).

In an embodiment, the orthographic projection of the conductive layer 30 on the base substrate 10 is located on an outer side of an orthographic projection of the touch signal line 410 on the base substrate 10, that is, the orthographic projection of the conductive layer 30 on the base substrate 10 is located on a side of the orthographic projection of the touch signal line 410 on the base substrate 10 away from the display area.

In an embodiment, the display substrate includes a plurality of inorganic layers, and the plurality of inorganic layers are located in an area other than the crack-prevention area 1024. That is, the inorganic layers of the display substrate are not provided in the crack-prevention area 1024. The plurality of inorganic layers of the display substrate may include the gate insulating layer 403, the capacitor insulating layer 404, the interlayer dielectric layer 405, and the inorganic layers of the encapsulation layer 60. As shown in FIG. 2 to FIG. 4C, the crack-prevention area 1024 is not provided with an inorganic layer, but is only provided with the planarization layer 406, the pixel definition layer 54, and the encapsulation layer 60, where the encapsulation layer 60 located in the crack-prevention area 1024 only includes the organic layer of the encapsulation layer 60, and the inorganic layers of the encapsulation layer 60 are not provided in the crack-prevention area 1024.

Since cracks tend to extend along the inorganic layer, by providing the inorganic layers of the display substrate in the area other than the crack-prevention area 1024, it is more helpful to improve the effect of the crack-prevention area 1024 in preventing the cracks from extending toward the display area 101, further improving the display reliability of the display panel.

In an embodiment, the conductive layer 30 is connected to a ground signal, or the conductive layer is connected to a low-level power signal. Both the ground signal and the low-level power signal are constant electrical signals.

In an embodiment, the conductive layer 30 covers at least a portion of the crack detection area.

Figure 2:
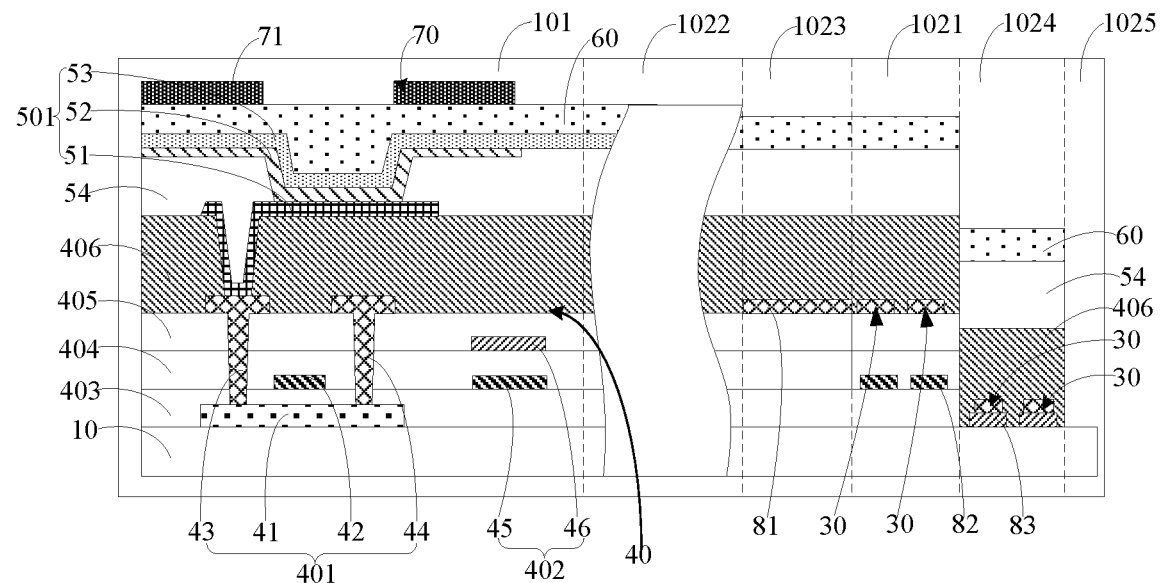
FIG. 2 is a partial cross-sectional view of a display substrate according to an exemplary embodiment of the present application.

In an embodiment, as shown in FIG. 2, the conductive layer 30 is a patterned film layer. The orthographic projection of the conductive layer 30 on the base substrate 10 may substantially coincide with the orthographic projection of the detection wiring 82 on the base substrate 10. The orthographic projection of the conductive layer 30 on the base substrate 10 substantially coinciding with the orthographic projection of the detection wiring 82 on the base substrate 10 means that the orthographic projection of the conductive layer 30 on the base substrate covers the orthographic projection of the detection wiring 82 on the base substrate 10, or the orthographic projection of the conductive layer 30 on the base substrate mostly overlaps with the orthographic projection of the detection wiring 82 on the base substrate 10, and an edge of the orthographic projection of the conductive layer 30 on the base substrate does not overlap, at least in part, with an edge of the orthographic projection of the detection wiring 82 on the base substrate 10, or the conductive layer 30 is a patterned film layer, and an orthographic projection of a hollowed-out area of the conductive layer 30 on the base substrate at least partially exposes an area where the orthographic projection of the detection wiring 82 on the base substrate 10 is located.

In another embodiment, as shown in FIG. 3 to FIG. 7, the conductive layer 30 covers the crack detection area 1021. A portion of the conductive layer 30 disposed in the crack detection area 1021 may be a continuous film layer without being patterned, to cover the crack detection area 1021. In this way, the conductive layer 30 provides better shielding against electrostatic charges, and can more effectively prevent the electrostatic charges from being transferred to the thin-film transistors in the pixel circuit layer 40.

In an embodiment, the conductive layer 30 is arranged in the same layer with at least one of the conductive film layers in the pixel circuit layer 40. In this way, the conductive layer 30 is formed simultaneously with the at least one conductive film layer in the pixel circuit layer 40 in a single patterning process, which helps to simplify the preparation process of the display substrate.

Further, the conductive layer 30 is arranged in the same layer with the low-level power signal line 81. In this way, the conductive layer 30 and the low-level power signal line 81 may be formed in a single patterning process, which can further simplify the preparation process.

Figure 3:
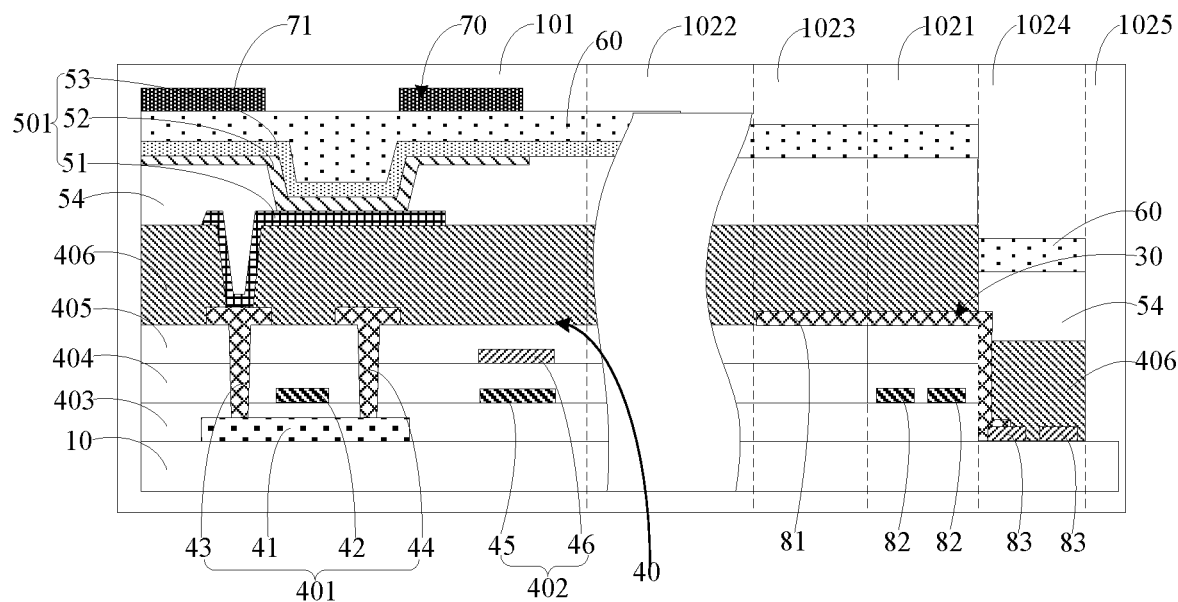
FIG. 3 is a partial cross-sectional view of a display substrate according to another exemplary embodiment of the present application.

In some embodiments, as shown in FIG. 2 and FIG. 3, the conductive layer 30 is arranged in the same layer as the source electrode of the thin-film transistor 401. In this way, during the conduction of the electrostatic charges in the crack-prevention area 1024 in a direction close to the base substrate, the electrostatic charges are shielded by the conductive layer 30 when conducted to the conductive layer 30, and cannot continue to conduct downward through the conductive layer 30, while the gate electrode, the active layer, and the capacitor are located on the side of the conductive layer 30 close to the base substrate, the probability of electrostatic charge conduction to the gate electrode, the active layer, and the capacitor is greatly reduced, and the conductive layer 30 can better prevent the electrostatic charges from affecting the pixel circuit.

In this embodiment, the conductive material layer 83 is arranged in the same layer as the gate electrode of the thin-film transistor or the second capacitor plate of the capacitor, and the conductive layer 30 is in direct contact with the conductive material layer when no inorganic layers are provided in the crack-prevention area 1024, such that the conductive layer 30 is electrically connected to the conductive material layer.

In an embodiment, as shown in FIG. 3, the conductive layer 30 is connected to the low-level power signal line 81. The conductive layer 30 and the low-level power signal line 81 may be located in the same layer, and the conductive layer 30 is continuous with the low-level power signal line 81. In this way, both the conductive layer 30 and the low-level power signal line 81 are connected to the low-level power signal, and there is no need to provide a wiring to connect the conductive layer 30 to the low-level power signal, which helps to simplify the wiring complexity of the display substrate.

In another embodiment, as shown in FIG. 2, the conductive layer 30 is spaced apart from the low-level power signal line 81, and the conductive layer 30 may be connected to a different signal than the low-level power signal line 81. For example, the conductive layer 30 is connected to a ground signal, and the low-level power signal line 81 is connected to a low-level power signal.

In an embodiment, as shown in FIG. 4A, the conductive layer 30 is located on a side of the low-level power signal line 81 away from the base substrate. At least a portion of an orthographic projection of the low-level power signal line 81 on the base substrate 10 falls within the orthographic projection of the conductive layer 30 on the base substrate 10, or an edge of the orthographic projection of the conductive layer 30 on the base substrate 10 close to the display area 101 coincides with an edge of the orthographic projection of the low-level power signal line 81 on the base substrate 10 away from the display area 101.

Since the low-level power signal line 81 is connected to the low-level power signal, which is a constant electrical signal, the low-level power signal line 81 can play the role of shielding electrostatic charges, and can prevent the electrostatic charges from being conducted to the display area 101 along the low-level power signal line 81. By setting the edge of the orthographic projection of the conductive layer 30 on the base substrate 10 close to the display area 101 to coincide with the edge of the orthographic projection of the low-level power signal line 81 on the base substrate 10 away from the display area 101, or at least a portion of the orthographic projection of the low-level power signal line 81 on the base substrate 10 to fall within the orthographic projection of the conductive layer 30 on the base substrate 10, the electrostatic charges cannot be conducted downward through the crack detection area 1021, and cannot be conducted downward through the power signal line area 1023, which is more helpful to prevent the electrostatic charges from being conducted to the thin-film transistor in the pixel circuit, and to ensure the display reliability of the display substrate.

Preferably, at least a portion of the orthographic projection of the low-level power signal line 81 on the base substrate 10 falls within the orthographic projection of the conductive layer 30 on the base substrate 10. As shown in FIG. 4A, the orthographic projection of the conductive layer 30 on the base substrate covers a portion of the orthographic projection of the low-level power signal line 81 on the base substrate. In this way, the conductive layer 30 and the low-level power signal line 81 provide better shielding against electrostatic charges.

In some embodiments, the low-level power signal line 81 surrounds the display area 101 and is overlapped with the cathodes of the sub-pixels. The low-level power signal line 81 may include a first film layer, a second film layer disposed on a side of the first film layer away from the base substrate 10, and a third film layer disposed on a side of the second film layer away from the base substrate. The first film layer is located in the same layer as the transfer portion, the second film layer is located in the same layer as the source electrodes, and the third film layer is located in the same layer as an ITO (indium tin oxide) layer in the anodes of the sub-pixels close to the base substrate.

In an embodiment, as shown in FIG. 4A, the conductive layer 30 is arranged in the same layer as the touch electrodes 71. That is, the conductive layer 30 and the touch electrodes 71 are formed in a single patterning process. In this embodiment, when the conductive material layer 83 is arranged in the same layer as the gate electrode of the thin-film transistor or the second capacitor plate of the capacitor, the conductive material layer 83 is electrically connected to the conductive layer 30 via through holes penetrating the organic layers therebetween. In the embodiment shown in FIG. 4A, the planarization layer 406, the pixel definition layer 54, and the organic layer of the encapsulation layer 60 are provided between the conductive layer 30 and the conductive material layer 83, and the conductive layer 30 is electrically connected to the conductive material layer 83 via through holes penetrating the planarization layer 406, the pixel definition layer 54, and the organic layer of the encapsulation layer 60.

In another embodiment, as shown in FIG. 4B, the conductive layer 30 is not overlapped with the conductive material layer 83. That is, the conductive layer 30 is not electrically connected to the conductive material layer 83 through vias. The conductive layer 30 and the conductive material layer 83 may be connected to the same constant electrical signal through different wirings, or the conductive layer 30 and the conductive material layer 83 may be electrically connected together through different wirings, and then connected to the same constant electrical signal.

Further, the conductive layer 30 has a width ranging from 225 μm to 275 μm. The width of the conductive layer 30 is, for example, 225 μm, 230 μm, 235 μm, 240 μm, 245 μm, 250 μm, 255 μm, 260 μm, 265 μm, 270 μm, 275 μm, etc.

Figure 6:
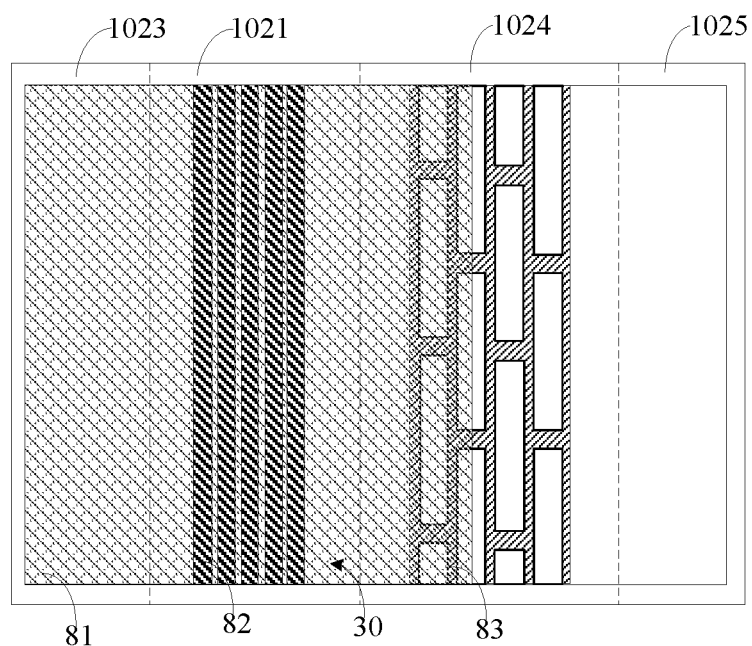
FIG. 6 is a schematic diagram of a partial structure of the display substrate shown in FIG. 3.
Figure 7:
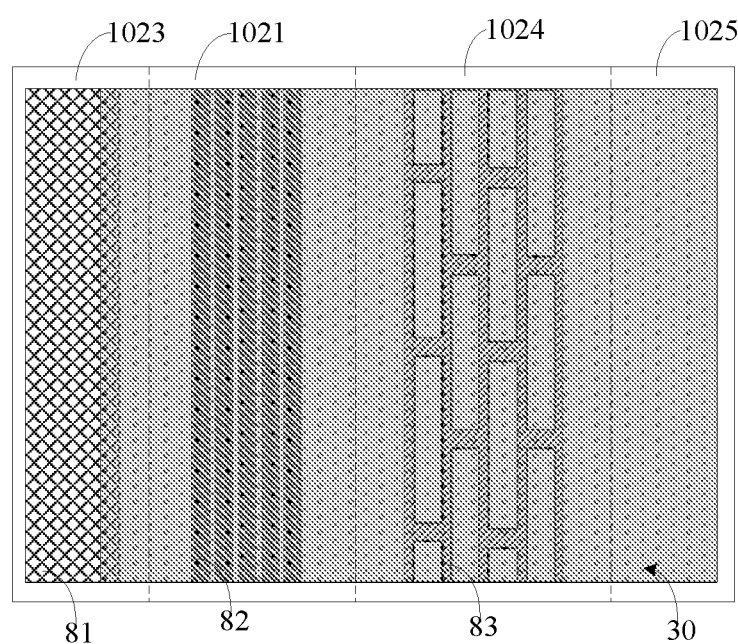
FIG. 7 is a schematic diagram of a partial structure of the display substrate shown in FIG. 4A.

In an embodiment, as shown in FIG. 4A and FIG. 7, the conductive layer 30 covers at least a portion of the cut-retention area 1025. In this way, when electrostatic charges are conducted downward through the film layer of the cut-retention area 1025, a portion of the conductive layer 30 located in the cut-retention area 1025 can block the electrostatic charges, further improving the display reliability of the display substrate. In some embodiments, as shown in FIG. 5 to FIG. 7, the conductive layer 30 is a continuous film layer without being patterned. In the embodiment shown in FIG. 5, the conductive layer 30 covers a portion of the crack-prevention area 1024 and the crack detection area 1021, and the conductive layer 30 is spaced apart from the low-level power signal line 81. In the embodiment shown in FIG. 6, the conductive layer 30 covers the crack detection area 1021 and a portion of the crack-prevention area 1024, and the conductive layer 30 is continuous with the low-level power signal line 81. In the embodiment shown in FIG. 7, the conductive layer 30 covers the crack detection area 1021, the crack-prevention area 1024, the cut-retention area 1025, and a portion of the power signal line area 1023.

Embodiments of the present application further provide a display apparatus, including the display substrate according to any one of the above embodiments.

In an embodiment, the display apparatus is a display panel, and the display panel further includes a polarizer disposed on a side of the touch layer 70 away from the base substrate, and a cover plate disposed on a side of the polarizer away from the base substrate. The display panel further includes an optical adhesive between the polarizer and the cover plate. The cover plate may be a glass cover plate.

In an embodiment, the display apparatus includes a housing and a display panel disposed in the housing.

The display apparatus according to the embodiments of the present application may be, for example, a mobile phone, a tablet computer, a TV set, a notebook computer, an in-vehicle device, or any other device with a display function.

Embodiments of the present application further provide a method of detecting cracks in a display substrate. The method is applied to the display substrate according to any one of the above embodiments. The method includes the following steps.

Firstly, a first capacitance value is detected, where the first capacitance value is the sum of capacitance values between the detection wiring and other conductive structures of the display substrate, the other conductive structures including the conductive layer.

Subsequently, in response to the first capacitance value being not within a capacitance threshold range, it is determined that there is a crack in the detection wiring.

The other conductive structures of the display substrate refer to all other conductive structures of the display substrate except the detection wiring, such as the capacitor plates in the pixel circuits, and conductive structures in the thin-film transistors. The capacitance threshold range is a range of capacitance values between the detection wiring and the other conductive structures of the display substrate when there is no crack in the detection wiring, and the capacitance threshold range is a known range of values.

In an embodiment, a voltage signal may be written to the conductive layer, and then a change in voltage of the detection wiring is detected, and a chip determines the first capacitance value based on the change in the voltage of the detection wiring.

In an embodiment, after determining that there is the crack in the detection wiring, the method further includes: determining a position of the crack in the detection wiring according to the first capacitance value.

Further, the detection wiring has the same thickness and width at each portion thereof, and determining the position of the crack in the detection wiring according to the first capacitance value includes:

determining a length of wiring between the position of the crack in the detection wiring and the beginning of the detection wiring; and determining the position of the crack in the detection wiring according to the length of wiring.

The length of wiring is calculated from the following equation:

$$Lx=(Cx-C0)*L/(C1-C0)$$

where Cx is the first capacitance value; C0 is a second capacitance value, the second capacitance value being the sum of capacitance values between the detection wiring and other conductive structures of the display substrate except the conductive layer; C1 is a third capacitance value, the third capacitance value being the sum of capacitance values between the detection wiring and other conductive structures of the display substrate including the conductive layer, when there is no crack in the detection wiring; L is a total length of the detection wiring, and Lx is the length of wiring between the position of the crack in the detection wiring and the beginning of the detection wiring.

The beginning of the detection wiring is an end of the detection wiring close to the chip.

It can be seen that, the crack detection method according to the embodiments of the present application can determine the position of the crack in the detection wiring and the crack detection accuracy is higher, compared to the scheme in which crack detection is performed by detecting a resistance of the wiring.

It should be noted that, sizes of layers and areas may be exaggerated in the drawings for clarity of illustration. Also, it may be understood that when an element or layer is referred to as being "on" another element or layer, it may be directly on the other element or intervening layers may be present. In addition, it may be understood that when an element or layer is referred to as being "under" another element or layer, it may be directly under the other element, or more than one intervening layer or element may be present. In addition, it may be understood that when a layer or element is referred to as being "between" two layers or elements, it may be the only layer between the two layers or elements, or more than one intervening layer or element may be present. Like reference numerals indicate like elements throughout.

Other embodiments of the present application may readily occur to those skilled in the art upon consideration of the specification and practice of the disclosure disclosed herein. The present application is intended to cover any modifications, uses, or adaptations thereof that follow the general principles of the present application and include common general knowledge or commonly used technical means in the art that are not disclosed in the present application. The specification and embodiments are to be considered exemplary only, with the true scope and spirit of the present application being indicated by the following claims.

It should be understood that the present application is not limited to the precise structures described above and illustrated in the drawings, and that various modifications and changes may be made without departing from the scope thereof. The scope of the present application is limited only by the appended claims.

The invention claimed is:

1. A display substrate, comprising a display area and a frame area disposed at least on a side of the display area, the frame area comprising a crack detection area,
wherein
the display substrate comprises a base substrate, a detection wiring on the base substrate, and a conductive layer on a side of the detection wiring away from the base substrate;
the conductive layer is disposed in the frame area;
the detection wiring is disposed in the crack detection area; and
at least a portion of an orthographic projection of the detection wiring on the base substrate falls within an orthographic projection of the conductive layer on the base substrate, and
wherein
the frame area further comprises a crack-prevention area located on a side of the crack detection area away from the display area;
the display substrate further comprises a patterned conductive material layer located in the crack-prevention area, and the conductive material layer is located between the conductive layer and the base substrate; and
at least a portion of an orthographic projection of the conductive material layer on the base substrate falls within the orthographic projection of the conductive layer on the base substrate.

2. The display substrate according to claim 1, wherein
the conductive layer is connected to a constant electrical signal; and
the conductive layer covers at least a portion of the crack detection area.

3. The display substrate according to claim 1, wherein the conductive material layer is in the form of a grid.

4. The display substrate according to claim 1, wherein the conductive material layer is electrically connected to the conductive layer.

5. The display substrate according to claim 1, wherein the display substrate comprises a plurality of inorganic layers, which are located in an area other than the crack-prevention area.

6. The display substrate according to claim 1, wherein
the frame area further comprises a power signal line area located between the crack detection area and the display area, and the display substrate further comprises a low-level power signal line located in the power signal line area; and
at least a portion of an orthographic projection of the low-level power signal line on the base substrate falls within the orthographic projection of the conductive layer on the base substrate; or an edge of the orthographic projection of the conductive layer on the base substrate close to the display area coincides with an edge of the orthographic projection of the low-level power signal line on the base substrate away from the display area.

7. The display substrate according to claim 1, wherein the display substrate comprises a touch layer disposed on the base substrate, the touch layer comprises a plurality of touch electrodes, and the touch layer is at least partially located in the display area; and the conductive layer and the touch electrodes are arranged in a same layer.

8. The display substrate according to claim 1, wherein the display substrate comprises a pixel circuit layer disposed on the base substrate, and the pixel circuit layer is at least partially located in the display area; and the pixel circuit layer comprises a plurality of conductive film layers, and the conductive layer and at least one of the conductive film layers in the pixel circuit layer are arranged in a same layer.

9. The display substrate according to claim 8, wherein
the pixel circuit layer comprises pixel circuits, each of which comprises a thin-film transistor and a capacitor, the thin-film transistor comprises a source electrode and a gate electrode, the capacitor comprises a first capacitor plate and a second capacitor plate, and the first capacitor plate and the gate electrode are arranged in a same layer; and
the plurality of conductive film layers comprise the gate electrode, the source electrode, and the second capacitor plate; and the conductive layer is arranged in a same layer as the source electrode.

10. The display substrate according to claim 9, wherein at least a portion of the detection wiring is arranged in a same layer as at least one of the gate electrode and the second capacitor plate.

11. The display substrate according to claim 1, wherein the frame area further comprises a power signal line area located between the crack detection area and the display area, and the display substrate further comprises a low-level power signal line located in the power signal line area; and the conductive layer is arranged in a same layer as the low-level power signal line.

12. The display substrate according to claim 11, wherein the conductive layer is connected to the low-level power signal line; or the conductive layer is connected to a different signal than the low-level power signal line.

13. The display substrate according to claim 1, wherein the frame area further comprises a cut-retention area located on a side of the crack-prevention area away from the crack detection area, and the conductive layer covers at least a portion of the cut-retention area.

14. The display substrate according to claim 1, wherein the conductive layer is connected to a ground signal; or the conductive layer is connected to a low-level power signal.

15. The display substrate according to claim 1, wherein the frame area further comprises a gate drive area located between the display area and the crack detection area, and the gate drive area is provided with gate drive circuits; and the conductive layer is located in an area other than the gate drive area.

16. A display apparatus, comprising the display substrate according to claim 1.

17. A method of detecting cracks in a display substrate, which is applied to the display substrate, the display substrate comprising a display area and a frame area disposed at least on a side of the display area, the frame area comprising a crack detection area; the display substrate comprising a base substrate, a detection wiring on the base substrate, and a conductive layer on a side of the detection wiring away from the base substrate; the conductive layer being disposed in the frame area; the detection wiring being disposed in the crack detection area; at least a portion of an orthographic projection of the detection wiring on the base substrate falling within an orthographic projection of the conductive layer on the base substrate; and the conductive layer being connected to a constant electrical signal, wherein the frame area further comprises a crack-prevention area located on a side of the crack detection area away from the display area; the display substrate further comprises a patterned conductive material layer located in the crack-prevention area, and the conductive material layer is located between the conductive layer and the base substrate; and at least a portion of an orthographic projection of the conductive material layer on the base substrate falls within the orthographic projection of the conductive layer on the base substrate, the method comprising:

detecting a first capacitance value, wherein the first capacitance value is the sum of capacitance values between the detection wiring and other conductive structures of the display substrate, the other conductive structures comprising the conductive layer; and determining that there is a crack in the detection wiring, in response to the first capacitance value being not within a capacitance threshold range.

18. The method according to claim 17, wherein after determining that there is the crack in the detection wiring, the method further comprises:

determining a position of the crack in the detection wiring according to the first capacitance value.

19. The method according to claim 18, wherein the detection wiring has same thickness and width at each portion thereof, and determining the position of the crack in the detection wiring according to the first capacitance value comprises:

determining a length of wiring between the position of the crack in the detection wiring and the beginning of the detection wiring; and determining the position of the crack in the detection wiring according to the length of wiring, wherein the length of wiring is determined from the following equation:

$$Lx=(Cx-C0)*L/(C1-C0)$$

wherein Cx is the first capacitance value; C0 is a second capacitance value, the second capacitance value being the sum of capacitance values between the detection wiring and other conductive structures of the display substrate except the conductive layer; C1 is a third capacitance value, the third capacitance value being the sum of capacitance values between the detection wiring and other conductive structures of the display substrate comprising the conductive layer, when there is no crack in the detection wiring; L is a total length of the detection wiring, and Lx is the length of wiring between the position of the crack in the detection wiring and the beginning of the detection wiring.

20. A method of detecting cracks in a display substrate, which is applied to the display substrate, the display substrate comprising a display area and a frame area disposed at least on a side of the display area, the frame area comprising a crack detection area; the display substrate comprising a base substrate, a detection wiring on the base substrate, and a conductive layer on a side of the detection wiring away from the base substrate; the conductive layer being disposed in the frame area; the detection wiring being disposed in the crack detection area; at least a portion of an orthographic projection of the detection wiring on the base substrate falling within an orthographic projection of the conductive layer on the base substrate; and the conductive layer being connected to a constant electrical signal, the method comprising:

detecting a first capacitance value, wherein the first capacitance value is the sum of capacitance values between the detection wiring and other conductive structures of the display substrate, the other conductive structures comprising the conductive layer;

determining that there is a crack in the detection wiring, in response to the first capacitance value being not within a capacitance threshold range; and determining a position of the crack in the detection wiring according to the first capacitance value, wherein the detection wiring has same thickness and width at each portion thereof, and determining the position of the crack in the detection wiring according to the first capacitance value comprises:

determining a length of wiring between the position of the crack in the detection wiring and the beginning of the detection wiring; and determining the position of the crack in the detection wiring according to the length of wiring, wherein the length of wiring is determined from the following equation:

$$Lx=(Cx-C0)*L/(C1-C0)$$

wherein Cx is the first capacitance value; C0 is a second capacitance value, the second capacitance value being the sum of capacitance values between the detection wiring and other conductive structures of the display substrate except the conductive layer; C1 is a third capacitance value, the third capacitance value being the sum of capacitance values between the detection wiring and other conductive structures of the display substrate comprising the conductive layer, when there is no crack in the detection wiring; L is a total length of the detection wiring, and Lx is the length of wiring between the position of the crack in the detection wiring and the beginning of the detection wiring.

* * * * *